United States Patent [19]

Boeke

[11] 4,371,844
[45] Feb. 1, 1983

[54] DIFFERENTIAL LOAD CIRCUIT EQUIPPED WITH FIELD-EFFECT TRANSISTORS

[75] Inventor: Wouter M. Boeke, Nijmegen, Netherlands

[73] Assignee: U.S. Philips Corporation, New York, N.Y.

[21] Appl. No.: 231,652

[22] Filed: Feb. 5, 1981

[30] Foreign Application Priority Data

Feb. 25, 1980 [NL] Netherlands ............... 8001120

[51] Int. Cl.³ ............................................. H03F 3/45
[52] U.S. Cl. .................................. 330/253; 330/261; 330/258
[58] Field of Search ............. 330/253, 257, 258, 261, 330/277, 288, 300

[56] References Cited

U.S. PATENT DOCUMENTS 4,247,824  1/1981  Hibourne ........................ 330/253

Primary Examiner—James B. Mullins
Assistant Examiner—Gene Wan
Attorney, Agent, or Firm—Robert T. Mayer; Bernard Franzblau

[57] ABSTRACT

A differential load circuit comprises first, second, third and fourth field-effect transistors of the same conductivity type having interconnected gate electrodes. The source electrodes of the first and second transistors are connected to a first power supply terminal and the drain electrodes of the third and fourth transistors to a second power supply terminal via quiescent current sources. A first input terminal is connected to the interconnected source and drain electrodes of the third and first transistors and a second input terminal is connected to the interconnected source and drain electrodes of the fourth and second transistors. An output terminal is connected to the drain electrode of the fourth transistor. Biasing means are coupled to the gate electrodes of the four transistors, and supply a voltage to the gate electrodes so that the common-mode drain currents of the third and fourth transistors correspond to the currents supplied by the quiescent current sources.

16 Claims, 6 Drawing Figures

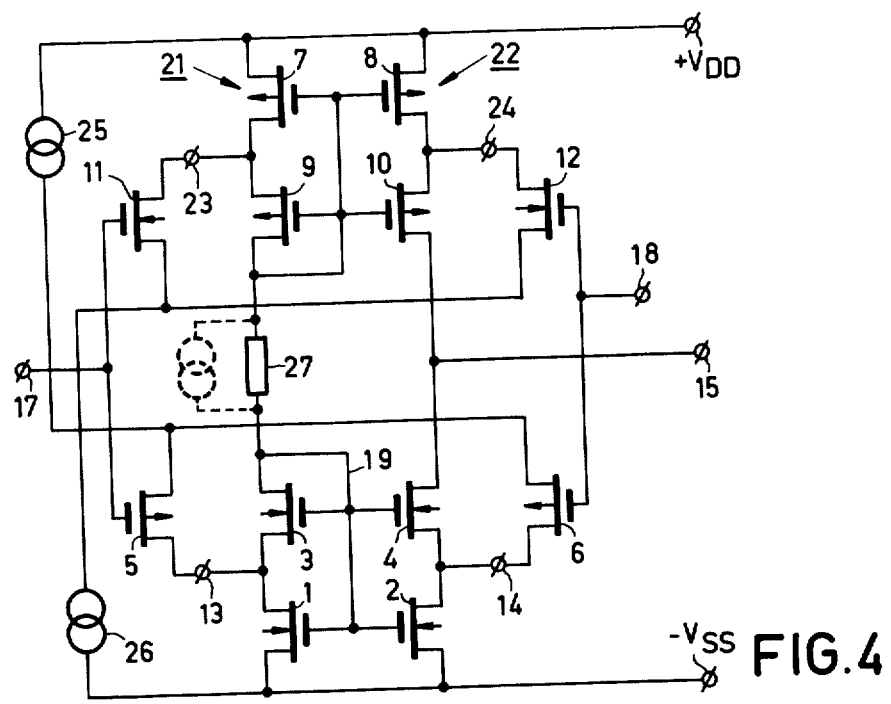
FIG.4
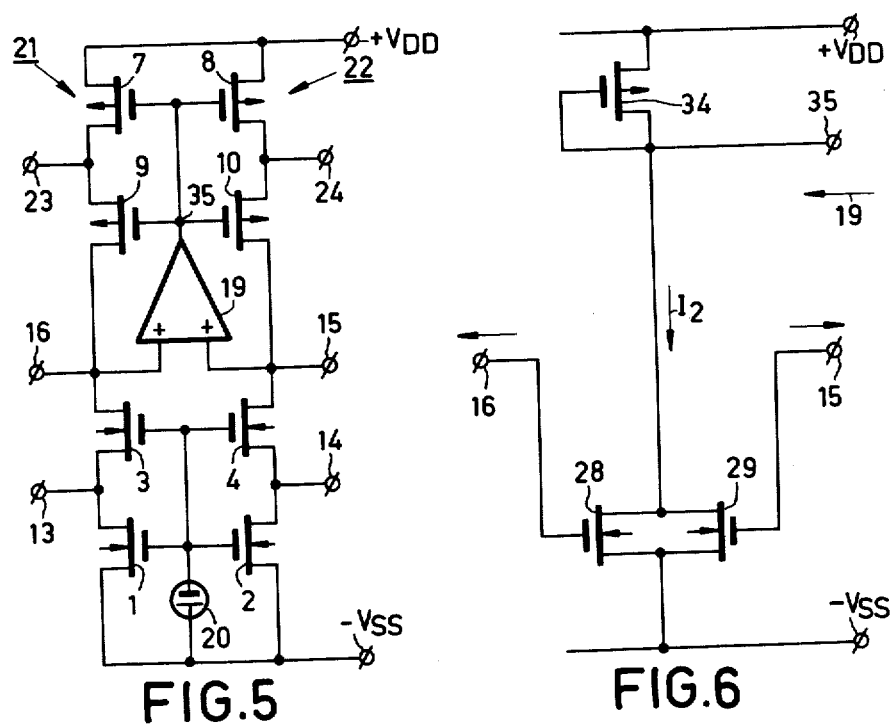
FIG.5
FIG.6

DIFFERENTIAL LOAD CIRCUIT EQUIPPED WITH FIELD-EFFECT TRANSISTORS

The invention relates to a differential load circuit equipped with field-effect transistors of the enhancement type having a first and a second input terminal and one common terminal. This load circuit also includes a first and second field-effect transistor of a first conductivity type, having source electrodes connected to the common terminal, gate electrodes that are interconnected and drain electrodes connected to the first and the second input terminal, respectively.

A load circuit of this type is known from "IEEE Journal of Solid-State Circuits", Vol. SC-13, no. 3, June 1978, pages 285-294, in particular FIG. 4, in which it is arranged as a current mirror through positive feedback between the drain electrode and the gate electrode of the first transistor and is included in the drain circuits of two transistors connected as a differential pair, for coupling out the signal.

Using such a current mirror arrangement as a load circuit has the drawback that the voltage across at least the first transistor is higher than the threshold voltage of this transistor, which threshold voltage may be comparatively high, for example, four volts. Since the correct operation of the amplifier requires that the transistors of the differential pair should not be operated outside the saturation range, i.e. not in the triode range, the common-mode voltage on the gate electrodes of these amplifier transistors relative to said common terminal should not become much lower than said threshold voltage, for example not lower than two volts. Furthermore, the voltage at the output is not independent of the common-mode input voltage owing to the direct coupling from the output terminal to the drain electrode of one of the amplifier transistors and the output voltage produces a comparatively substantial reaction on the load circuit. As a result of this the known load circuit is less suitable for use in input amplifiers which should be capable of handling a common mode input voltage which varies over a comparatively wide range without significantly influencing the gain of the differential input voltage.

It is an object of the invention to provide a differential load circuit of the type mentioned in the preamble which is adapted for use in a differential input stage and which will be capable of handling a common-mode input voltage which varies over a wide range and without significantly affecting the gain of the differential input voltage.

To this end the invention is characterized in that the circuit further comprises a third and a fourth field effect transistor with interconnected gate electrodes, a first and a second current source circuit for feeding quiescent currents to the third and the fourth transistors, the drain electrodes of the third and the fourth transistors being respectively connected to the first and the second current source circuits, the source electrodes of the third and the fourth transistors to the drain electrodes of the first and the second transistors respectively, and the gate electrodes to the gate electrodes of the first and the second transistors. At least one first output terminal is connected to the drain electrode of the fourth transistor. The novel circuit also includes biasing means for biasing the gate electrodes of the first, second, third and fourth transistors to a potential such that the third and the fourth transistors carry the quiescent currents supplied by the current source circuits.

This load circuit meets the said requirements in that the voltage at the first and the second input terminal is equal to the gate-source voltage of the first and the second transistors respectively minus the gate-source voltage of the third and the fourth transistor respectively, which voltage may be substantially lower than the threshold voltage of the transistors used, without the first and the second transistors becoming fully desaturated. In practice, a residual voltage of, for example, one volt at the input terminals of the load circuit can readily be attained because the voltage at the drain electrode of the fourth transistor only depends on the voltage at the second input terminal to a small extent and because the second transistor functions as a high-ohmic source impedance of the fourth transistor. This considerably reduces the reaction of the voltage on the drain electrode of the fourth transistor.

In respect of the said biasing means the load circuit in accordance with the invention may further be characterized in that said basing means comprise positive feedback between the drain electrode and the gate electrode of the third transistor.

This embodiment is very simple and suitable for a single-ended output. If a differential output is required by the addition of an output terminal connected to the drain electrode of the third transistor, it is not possible to use positive feedback between the drain electrode and the gate electrode of the third transistor, i.e. in its simplest form a short-circuit.

An embodiment which is suitable for a differential output may be characterized in that the gate electrodes of the first, second, third and fourth transistors are connected to a voltage reference source and the said biasing means comprise a feed-forward amplifier for receiving the common-mode voltage level at the drain electrodes of the third and the fourth transistor and for controlling the first and the second current source circuits in such a way that said current-source circuits, in respect of the common-mode current level, follow the common-mode drain current level of the third and the fourth transistor.

An embodiment, which is an alternative to this, may be characterized in that the biasing means comprise a feed-forward amplifier for receiving the common mode voltage level at the drain electrodes of the third and the fourth transistor and driving the common gate electrodes of the first, second, third and fourth transistors, in such a way that the third and the fourth transistor, in respect of the common-mode drain current level, follow the common-mode current level of the first and the second current source circuits.

A load circuit in accordance with the invention may be driven at both inputs by a first differential amplifier comprising a fifth and a sixth transistor of a second conductivity type opposed to the first conductivity type. The fifth and sixth transistors are arranged as a differential pair with their gate electrodes constituting an input, the drain electrode of the fifth transistor being connected to the drain electrode of the first transistor and the drain electrode of the sixth transistor being connected to the drain electrode of the second transistor. This load circuit may be further characterized in that the first and the second circuits source circuit are constituted by the series connection of the channels of a seventh and a ninth and of the channels of an eighth and a tenth field-effect transistor of the second conductivity type. The source electrodes of the seventh and the eighth transistors are connected to a second common point and the gate electrodes are interconnected and connected to the gate electrodes of the ninth and the tenth transistors. The drain electrodes of the ninth and the tenth transistors respectively are connected to the drain electrodes of the third and the fourth transistors and the source electrodes of the ninth and the tenth transistor respectively are connected to the drain electrodes of eleventh and twelfth field effect transistors of the first conductivity type, whose gate electrodes are connected to the gate electrode of the fifth and the sixth transistors respectively and whose source electrodes are commoned.

Such a circuit arrangement is a combination of two differential pairs of opposite conductivity types each with a load circuit in accordance with the invention which constitute each other's quiescent-current sources. Such a circuit arrangement has an input common-mode range which extends even beyond the value of the two supply voltages (positive and negative).

The invention will be described in more detail with reference to the drawing, in which:

FIG. 4 shows a combination of two differential amplifiers of FIG. 1 of opposite conductivity types with combined load circuit;

FIG. 5 represents a modification of the load circuit employed in the circuit arrangement of FIG. 4, and FIG. 6 represents an example of the common mode feed-forward amplifier employed in the circuit arrangements of FIGS. 4 and 5.

Figure 1:
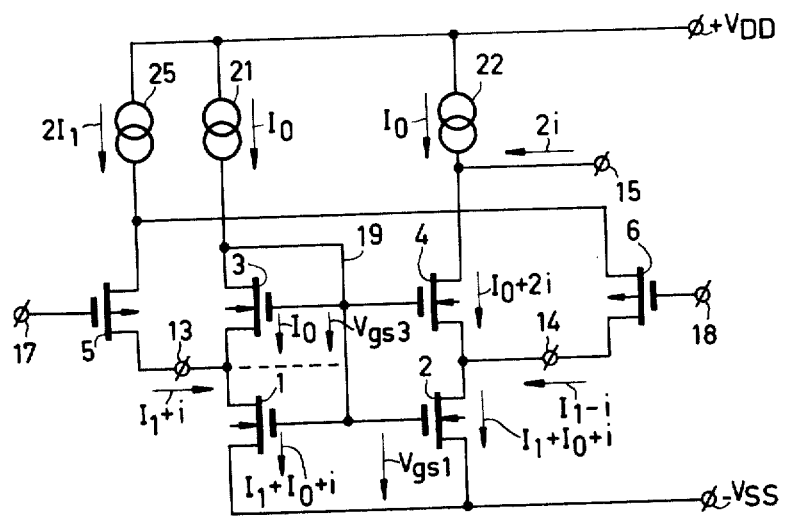
FIG. 1 shows a first embodiment of a load circuit in accordance with the invention used in a differential amplifier.

FIG. 1 shows a differential amplifier with a load circuit in accordance with the invention. It comprises a differential amplifier with p-channel transistors 5 and 6 having source electrodes connected to a current source 25 which supplies a current $2I_1$. The gate electrodes of the transistors 5 and 6 are connected to inputs 17 and 18. The load circuit comprises n-channel transistors 1, 2, 3 and 4. The gate electrodes of these transistors are directly connected to the drain electrode of transistor 3. It is also possible to provide a connection via a voltage follower. The source electrodes of the transistors 1 and 2 are connected to a negative power supply terminal $-V_{SS}$ and the drain electrodes to the source electrodes of transistor 3 and of transistor 4, respectively, and to the drain electrodes of transistor 5 and transistor 6, respectively. The drain electrodes of transistors 3 and 4 are connected to quiescent-current sources 21 and 22, which each carry a current $I_0$. A single-ended output terminal 15 is connected to the drain electrode of transistor 4.

A differential voltage between inputs 17 and 18 causes a distribution of the current $2I_1$ among the drain electrodes of transistors 5 and 6. The current in the drain circuit of transistor 5, which leads to an input 13 of the load circuit, may then be represented by $I_1+i$ and the current in drain circuit of transistor 6, which leads to input 14 of the load circuit, by $I_1-i$, $I_1$ being the common mode output current and $i$ the signal component. Via the source electrode of transistor 3, which is low-ohmic relative to the drain electrode of transistor 1, and the connection between the drain electrode of transistor 3 and the gate electrode of transistor 1, transistor 1 is driven so that it receives the current $I_1+i$ as well as the current $I_0$ which flows via transistor 3. The current $I_0+I_1+i$ which flows through transistor 1 is almost completely "reflected" to transistor 2; a slight deviation is possible because transistors 1 and 2 are operated at the boundary of the saturation range. Since the current $I_1-i$ is applied to input 14 of the load circuit, a current equal to $I_0+2i$ will flow through transistor 4, whose signal component $2i$ is available at output 15.

The signal current $2i$ appears at output 15 and the d.c. level at output 15 is not limited by the common mode voltage level at inputs 17 and 18 of the differential pair 5 and 6, which would be the case if a conventional current mirror were included in the drain circuits of transistors 5 and 6, so that the output would be connected to the drain electrode of the transistor 6. Since transistor 2 functions as a comparatively high-ohmic source load for transistor 4, the reaction of the signal voltage on output 15 is very small.

As regards the common mode range on inputs 17 and 18 the operation of the load circuit is as follows: On the gate electrodes of transistors 3 and 4 a voltage equal to the source-gate voltage $V_{gs1}$ of transistor 1 is present. The transistors 3 and 4 have a source-gate voltage equal to $V_{gs3}$, so that the direct voltage at inputs 13 and 14 of the load circuit equals $V_{gs1}-V_{gs2}$. Although the source-gate voltages $V_{gs1}$ and $V_{gs2}$ are each greater than the threshold voltage of the field-effect transistors used, for example 3 V, the voltage $V_{gs1}-V_{gs2}$ is substantially lower, for example 1 V. This means that in the present embodiment the common mode voltage at inputs 17 and 18 of the differential pair may even be negative without transistors 5 and 6 being desaturated, which is not the case if a conventional current mirror is included in the drain circuits of transistors 5 and 6. The voltage on at least one of the drain electrodes of transistors 5 and 6 then is limited to, for example, two volts by the threshold voltage of the transistors used. In a practical embodiment of the circuit of FIG. 1 the differential amplifier still performed satisfactorily at a common-mode input level exceeding the negative supply voltage $V_{SS}$.

In order to ensure that transistors 1 and 2 still operate sufficiently far in the saturation range, the d.c. level at points 13 and 14 of the load circuit may be influenced by dimensioning the channels of transistors 1 and 2 relative to the channels of transistors 3 and 4 in such a way that the ratio W/L, W being the channel width and L being the channel length, the transistors 1 and 2 is small relative to the ratio W/L of transistors 3 and 4. In other words, transistors 1 and 2 represent a higher d.c. impedance than transistors 3 and 4 under similar conditions.

Figure 2:
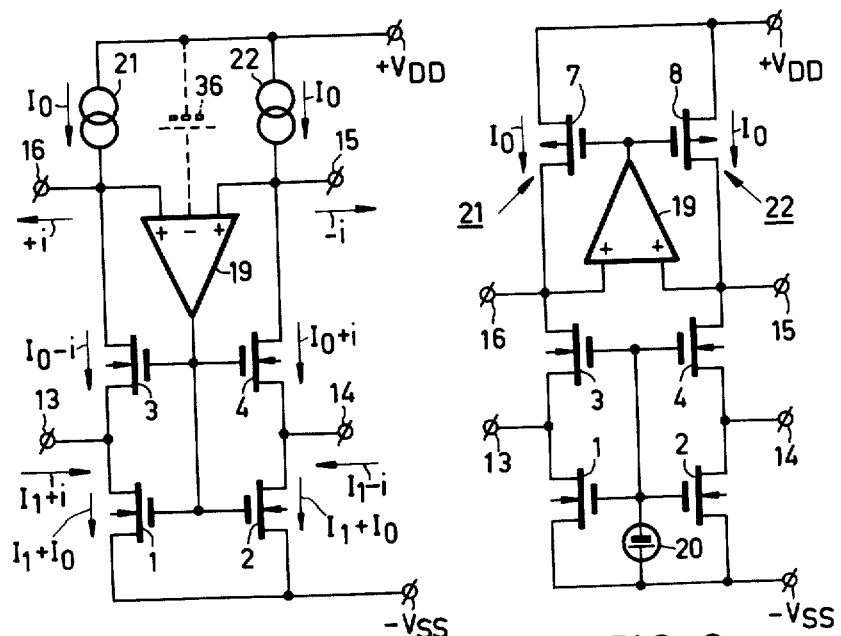
FIG. 2 shows a modification of the load circuit used in the circuit arrangement of FIG. 1.

FIG. 2 shows a variant of the load circuit employed in the circuit arrangement of FIG. 1, the input differential amplifier comprising transistors 5 and 6 not being shown for the sake of simplicity.

In the load circuit of FIG. 2 the gate electrodes of transistors 1, 2, 3 and 4 are not driven from the drain electrode of transistor 3, but by the common-mode voltage at the drain electrodes of transistors 3 and 4. The drain electrode of transistor 3 is then connected to an output terminal 16. Owing to the common mode drive with amplifier 19 (an example of a common-mode amplifier is shown in U.S. Pat. No. 3,914,683) the quiescent currents $I_0$ will flow through the transistors 1, 2, 3 and 4 and the common mode component $I_1$ of the currents applied to inputs 13 and 14 will flow through transistors 1 and 2. The signal components $+i$ and $-i$ of the currents applied to inputs 13 and 14 flow to output terminals 15 and 16 via the low-ohmic source electrodes of transistors 3 and 4.

In comparison with the load circuit in the arrangement of FIG. 1, transistors 1 and 2 carry the common-mode currents $I_1+I_0$ and the signal currents flow to the differential outputs 15,16 whereas in the load circuit shown in FIG. 1 transistors 1 and 2 carry the common-mode currents $I_0+I_1$ and the signal component $+i$ obtained from transistor 5, so that a signal current equal to $2i$ will flow to the single-ended output 15.

As is shown dashed in FIG. 2, the common mode amplifier 19 may include a voltage reference source 36. Control is then such that the common-mode level at outputs 15 and 16 will correspond to the voltage from said reference source 36. Such a voltage reference may also be implicitly available in the amplifier 19.

Figure 3:
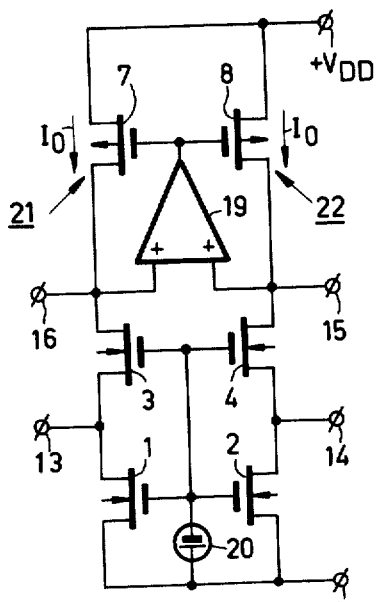
FIG. 3 represents another modification of the load circuit employed in the circuit arrangement of FIG. 1.

FIG. 3 shows a variant of the arrangement of FIG. 2, the gate electrodes of the transistors 1, 2, 3 and 4 being at a fixed voltage obtained from a voltage reference source 20. A common-mode amplifier 19 controls the current sources 21 and 22 in such a way that their common-mode currents $I_0$ correspond to the common-mode currents in the drain circuits of the transistors 3 and 4. The current sources 21 and 22 are constituted by p-channel transistors 7 and 8 which are driven at their common gate electrode by amplifier 19. Otherwise the circuit operates in a similar way to the circuit arrangement in accordance with FIG. 2.

In the circuit arrangement of FIG. 1 the common-mode range at the inputs 17 and 18 at least corresponds to the negative supply voltage $-V_{SS}$, but does not extend up to the positive supply voltage $V_{dd}$. The positive common-mode swing is limited by the source-gate voltage of transistor 3 and the voltage required for current source 21, for example 4 V in total.

A circuit arrangement which provides a maximum common-mode excursion in both directions is shown in FIG. 4, which includes the circuit arrangement of FIG. 1, the current sources 21 and 22 being constituted by the load circuit of a similar but complementary circuit arrangement, whose quiescent current sources in their turn are constituted by the load circuit of the first-mentioned circuit arrangement. The elements 7, 8, 9, 10, 11, 12 and points $+V_{DD}$, 23, 24, 15, 17 and 18 of the complementary half correspond to the elements 1, 2, 3, 4, 5 and 6 respectively and points $-V_{SS}$, 13, 14, 15, 17 and 18 respectively. The drain circuits of transistors 9 and 10 constitute the quiescent current sources for the load circuit with transistors 1, 2, 3 and 4 and the drain circuits of transistors 3 and 4 constitute the quiescent current sources for the load circuit with transistors 7, 8, 9 and 10. The two halves operate fully identically to the circuit of FIG. 1, but in a complementary manner. A differential voltage between inputs 17 and 18 results in an output signal current at output 15. The one half of the circuit arrangement is operative for a common-mode voltage at inputs 17 and 18 beyond the negative supply voltage $-V_{SS}$ and the other half for a common-mode voltage at inputs 17 and 18 beyond the positive supply voltage $+V_{DD}$.

In order to obtain the quiescent currents a resistor 27 is included between the drain circuits of the transistors 3 and 9, through which a current equal to $(V_{DD}+V_{SS}-2V_{gs})/R$ flows where $2V_{gs}$ is the sum of the source-gate voltages of transistors 1 and 7 and R is the resistance value of resistor 27. Instead of a resistor 27, it is possible to employ a current source as is shown dashed in FIG. 4.

In the same way that the circuit of FIG. 4 comprises two mutually complementary versions of the arrangement of FIG. 1, the circuits of FIGS. 2 and 3 may also be combined with their complements. FIG. 5 by way of illustration shows the load circuit of FIG. 3, constituted by its complement, transistors 7, 8, 9 and 10 corresponding to and being complementary to transistors 1, 2, 3 and 4 respectively. The input differential stage made up of transistors 5, 6, 11 and 12 (FIG. 4) is not shown for the sake of simplicity. The common-mode amplifier 19 drives the gate electrodes of transistors 7, 8, 9 and 10. The load circuit including transistors 1, 2, 3 and 4, with the transistors combinations 7, 9 and 8, 10 as quiescent current sources, corresponds to the load circuit of FIG. 3, while viewed from the load circuit including transistors 7, 8, 9 and 10 and the transistor combinations 1, 3 and 2, 4 as quiescent current sources, the situation corresponds to the complement of the load circuit of FIG. 2.

FIG. 6 by way of illustration shows an example of a common-mode amplifier which may be employed in the common-mode amplifiers of FIGS. 3 and 5 and in a complementary manner in the arrangement of FIG. 2. It comprises two parallel-connected n-channel transistors 28 and 29, whose gate electrodes receive the voltages at outputs 15 and 16. The current $I_2$, which flows in the common drain circuit of transistors 28 and 29, is consequently a measure of the common-mode voltage at outputs 15 and 16. The gate-source voltage of the transistors 28 and 29 then functions as an internal reference voltage. Across a p-channel transistor 34, whose gate and drain electrodes are interconnected, the current $I_2$ is converted into a voltage which appears at point 35, which point is connected to the gate electrodes of the transistors 7 and 8. In combinations with the transistors 7 and 8 in the circuits of FIGS. 3 and 5, transistor 34 operates as a current mirror.

What is claimed is:

1. A differential load circuit equipped with field-effect transistors of the enhancement type comprises, first and second input terminals and a common terminal, a first and a second field-effect transistor of a first conductivity type having source electrodes connected to the common terminal, gate electrodes interconnected and drain electrodes connected to the first and second input terminals, respectively, a third and a fourth field effect transistor with interconnected gate electrodes, a first and a second current source circuit feeding quiescent currents to the third and the fourth transistor by connecting the drain electrodes of the third and the fourth transistor to the first and the second current source circuit, respectively, means connecting the source electrode of the third and the fourth transistor to the drain electrode of the first and the second transistor, respectively, and means connecting the gate electrodes of the third and fourth transistors to the gate electrodes of the first and the second transistor, at least one first output terminal connected to the drain electrode of the fourth transistor, and biasing means for biasing the gate electrodes of the first, second, third and fourth transistors to a potential such that the third and the fourth transistors carry the quiescent currents supplied by the current source circuits.

2. A differential load circuit as claimed in claim 1, wherein said biasing means comprise a positive feedback between the drain electrode and the gate electrode of the third transistor.

3. A differential load circuit as claimed in claim 1, wherein the gate electrodes of the first, second, and third and fourth transistors are connected to a voltage reference source and said biasing means comprise a feed-forward amplifier receiving the common-mode voltage level on the drain electrodes of the third and the fourth transistor and controlling the first and the second current source circuits so that said current source circuits, in respect of the common mode current level, follow the common mode drain current level of the third and the fourth transistor.

4. A differential load circuit as claimed in claim 1, wherein the biasing means comprise a feed-forward amplifier receiving the common-mode voltage level on the drain electrodes of the third and the fourth transistors and driving the common gate electrodes of the first, second, third and fourth transistors so that the third and the fourth transistors, in respect of the common-mode drain current level, follow the common-mode current level of the first and the second current source circuits.

5. A differential load circuit as claimed in any one of claims 1–4, which is driven at both input terminals by a first differential amplifier comprising a fifth and a sixth transistor of a second conductivity type opposite to the first conductivity type, said fifth and sixth transistors being connected as a differential pair, with their gate electrodes constituting an input, means connecting the drain electrode of the fifth transistor to the drain electrode of the first transistor and the drain electrode of the sixth transistor to the drain electrode of the second transistor, said first and second current source circuits respectively comprising the series connection of the channels of a seventh and a ninth and of the channels of an eighth and a tenth field-effect transistor of the second conductivity type, the source electrodes of the seventh and the eighth transistor being connected to a second common point and the gate electrodes being interconnected and connected to the gate electrodes of the ninth and the tenth transistor, the drain electrodes of the ninth and the tenth transistors being connected to the drain electrodes of the third and fourth transistors, respectively, and the source electrodes of the ninth and the tenth transistors, respectively, being connected to the drain electrodes of an eleventh and a twelfth field-effect transistor of the first conductivity type having gate electrodes connected to the gate electrodes of the fifth and the sixth transistors, respectively, and having source electrodes connected together.

6. A differential load circuit as claimed in claim 5, when appendant to claim 2, wherein the gate electrodes of the seventh, eighth, ninth and tenth transistor are connected to the drain electrode of the ninth transistor in a regenerative sense and further comprising a current-sensing element included between the drain electrodes of the third and the ninth transistors.

7. A differential load circuit as claimed in claim 5, when appendant to claim 3, wherein an output of the feed-forward amplifier is coupled to the commoned gate electrodes of the seventh, eighth, ninth and tenth transistors.

8. A differential load circuit as claimed in claim 5, when appendant to claim 4, wherein the drain electrodes of the seventh, eighth, ninth and tenth transistors are connected to a voltage reference source.

9. A differential load circuit as claimed in any one of claims, 1–4 wherein the ratio of the width and length of the channels of the first and second transistors is comparatively small relative to the ratio of the width and length of the channels of the third and fourth transistors.

10. A differential load circuit as claimed in claim 5 wherein the ratio of the width and the length of the channels of the first, second, seventh and eighth transistors is comparatively small relative to the ratio of the width and length of the channels of the third, fourth, ninth and tenth transistors.

11. A differential load circuit as claimed in claim 6 wherein the ratio of the width and the length of the channels of the first, second, seventh and eighth transistors is comparatively small relative to the ratio of the width and the length of the channels of the third, fourth, ninth and tenth transistors.

12. A differential load circuit as claimed in claim 7 wherein the ratio of the width and the length of the channels of the first, second, seventh and eighth transistors is comparatively small relative to the ratio of the width and the length of the channels of the third, fourth, ninth and tenth transistors.

13. A differential load circuit as claimed in claim 8 wherein the ratio of the width and the length of the channels of the first, second, seventh and eighth transistors is comparatively small relative to the ratio of the width and the length of the channels of the third, fourth, ninth and tenth transistors.

14. A differential load circuit as claimed in claim 5 wherein the ratio of the width and the length of the channels of the first and second transistors is comparatively small relative to the ratio of the width and length of the channels of the third and fourth transistors.

15. A differential load circuit comprising, first and second power supply terminals, first, second, third and fourth field-effect transistors of the enhancement type, first and second current source circuits, means connecting the first current source circuit and the first and third transistors in a first series circuit across said supply terminals, means connecting the second current source circuit and the second and fourth transistors in a second series circuit across said supply terminals, first and second input terminals connected to respective junction points between the first and third transistors and the second and fourth transistors, means interconnecting the gate electrodes of the first, second, third and fourth transistors, an output terminal connected to an output electrode of the fourth transistor, and means for biasing the gate electrodes of said transistors to a voltage such that the third and fourth transistors carry quiescent currents supplied by the first and second current source circuits, respectively.

16. A differential load circuit as claimed in claim 15, wherein said biasing means comprises means coupling an output electrode and the gate electrode of the third transistor to provide a positive feedback therebetween.

* * * * *